(12) United States Patent
Pabari

(10) Patent No.: US 8,001,438 B1
(45) Date of Patent: Aug. 16, 2011

(54) MEASURING BRIDGE-FAULT COVERAGE FOR TEST PATTERNS WITHIN INTEGRATED CIRCUITS

(75) Inventor: Deepak M. Pabari, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 347 days.

(21) Appl. No.: 12/192,741

(22) Filed: Aug. 15, 2008

(51) Int. Cl.
*G01R 31/28* (2006.01)
*G01R 27/28* (2006.01)
*G01R 31/00* (2006.01)
*G01R 31/14* (2006.01)
*G01R 31/08* (2006.01)
*G01R 31/02* (2006.01)
*G06F 11/00* (2006.01)
*G06F 17/50* (2006.01)
*G06F 9/455* (2006.01)
*G06F 11/22* (2006.01)
*G11C 7/00* (2006.01)
*G11C 29/00* (2006.01)

(52) U.S. Cl. ........ 714/741; 714/724; 702/117; 365/201; 703/14; 716/104; 716/106; 716/136; 716/115; 324/526; 324/537

(58) Field of Classification Search ................ None
See application file for complete search history.

(56) References Cited

U.S. PATENT DOCUMENTS

| | | | |
|---|---|---|---|
| 7,363,605 B1 * | 4/2008 | Kondratyev et al. ............... | 716/6 |
| 7,509,600 B2 * | 3/2009 | Rajski et al. ....................... | 716/4 |
| 7,620,853 B1 * | 11/2009 | Kasnavi et al. .................. | 714/42 |
| 2005/0240887 A1 * | 10/2005 | Rajski et al. ...................... | 716/4 |
| 2007/0201618 A1 * | 8/2007 | Nozuyama .................. | 379/14.01 |
| 2007/0260408 A1 * | 11/2007 | Nozuyama ....................... | 702/59 |
| 2009/0055787 A1 * | 2/2009 | Oh et al. ........................... | 716/6 |
| 2009/0183128 A1 * | 7/2009 | Rajski et al. ....................... | 716/4 |

OTHER PUBLICATIONS

Xijiang Lin, Janusz Rajski, The Impacts of Untestable Defects on Transition Fault Testing, 2006, IEEE VLSI Test Symposium, pp. 1-6.*
Yiming Gong and Sreejit Chakravarty, IEEE Transactions on Computer-Aided Design of Integrated Circuits and Systems, vol. 17, No. 9, Sep. 1998.*
David B. Lavo, Brian Chess, Tracy Larrabee, and F. Joel Ferguson, Diagnosing Realistic Bridging Faults with Single Stuck-At Information, 1998m, vol. 17.*

* cited by examiner

*Primary Examiner* — Cynthia Britt
*Assistant Examiner* — Guerrier Merant
(74) *Attorney, Agent, or Firm* — Kevin T. Cuenot; LeRoy D. Maunu

(57) ABSTRACT

A computer-implemented method of measuring bridge fault coverage for a test pattern for a circuit design to be implemented within a programmable logic device can include identifying simulation results and stuck at coverage of the circuit design for the test pattern (610, 620). Pairs of nets in the circuit design that are adjacent can be identified (625). Each type of bridge fault for which each pair is tested can be determined according to the simulation results (640, 645, 655, 660). A measure of bridge fault coverage for the test pattern can be calculated according to which types of bridge faults each pair is tested and which net of each pair acts as an aggressor for each type of bridge fault tested (675). The measure of bridge fault coverage can be output (680).

13 Claims, 3 Drawing Sheets

MEASURING BRIDGE-FAULT COVERAGE FOR TEST PATTERNS WITHIN INTEGRATED CIRCUITS

FIELD OF THE INVENTION

The embodiments disclosed herein relate to integrated circuit devices (ICs). More particularly, the embodiments relate to measuring bridge fault coverage of a test pattern used to test a circuit design for a programmable logic device type of IC.

BACKGROUND OF THE INVENTION

Integrated circuits are subjected to rigorous testing to ensure that the resulting integrated circuit (IC) is of high quality. One popular method of testing ICs relies upon a type of fault model called a "stuck-at fault." The stuck-at (SA) fault model is used by fault simulators and Automatic Test Pattern Generation (ATPG) tools to mimic a manufacturing defect within an IC. The model reflects the behavior of the IC when individual signals or pins are assumed to be stuck at a logical one or a logical zero. In this manner, the SA fault model represents a typical circuit node shorted to power or ground.

SA fault testing involves applying a test pattern to an IC. A "test pattern" refers to a plurality of test vectors, e.g., a set of test vectors, where each test vector is a pattern of logic ones and zeros that can be input to particular ports of the IC. After introducing each test vector into the IC, the behavior of the IC, e.g., outputs, can be observed. For example, if a test vector is introduced into a source of a net, the behavior of the load of that net can be observed to determine whether the load switches or toggles between logic one and zero as expected according to the test vector provided to the source.

The sufficiency of a test pattern in terms of testing an IC can be determined through simulation, e.g., fault simulators and ATPG tools as noted. Each test vector typically tests for a single SA fault. A set of test vectors, therefore, can test for a plurality of different SA faults. The completeness of the test pattern, in terms of detecting SA faults for a particular circuit design, can be rated in terms of a percentage by simulating the circuit design using the test pattern. This percentage can be referred to as the SA fault coverage. For example, a coverage of 99.9% indicates that a test pattern will detect 99.9% of SA faults for a given circuit design.

While SA fault coverage has become a standard upon which the quality of an IC can be judged, the SA fault model is not applicable to all types of faults within an IC. Bridge faults, for example, are a type of fault that is not accurately represented by the SA fault model. Accordingly, while the quality of a test pattern for testing SA faults can be measured, the quality of that same test pattern for testing bridge faults is unknown.

SUMMARY OF THE INVENTION

The embodiments disclosed herein relate to measuring bridge fault coverage of a test pattern used to test a circuit design for a programmable logic device (PLD) type of IC. One embodiment of the present invention can include a computer-implemented method of measuring bridge fault coverage for a test pattern for a circuit design for a PLD. The computer-implemented method can include simulating the circuit design using the test pattern to generate simulation results and determining stuck at coverage for the test pattern. The computer-implemented method also can include calculating measures of bridge fault coverage for pairs of adjacent nets in the circuit design according to the stuck at coverage and the simulation results, determining a measure of bridge fault coverage for the entire circuit design according to the measures of bridge fault coverage for the pairs, and outputting the measure of bridge fault coverage.

Calculating measures of bridge fault coverage for pairs of adjacent nets can include identifying pairs of adjacent nets in the circuit design, wherein each pair of adjacent nets includes a first net and a second net, and, for each pair of adjacent nets, determining whether, during simulation, the first net is held constant while the second net toggles according to the test pattern applied to the second net. Determining whether, during simulation, the first net of the pair is held constant can include determining whether the first net of the pair is held at a logic zero while the second net toggles between a logic one and a logic zero according to the test pattern applied to the second net and determining whether the first net of the pair is held at a logic one while the second net toggles between a logic one and a logic zero according to the test pattern applied to the second net.

Calculating measures of bridge fault coverage for pairs of adjacent nets can include, for each pair of adjacent nets, determining whether, during simulation, the second net is held constant while the first net toggles according to the test pattern applied to the first net. Determining whether, during simulation, the second net of the pair is held constant can include determining whether the second net of the pair is held at a logic zero while the first net toggles between a logic one and a logic zero according to the test pattern applied to the first net and determining whether the second net of the pair is held at a logic one while the first net toggles between a logic one and a logic zero according to the test pattern applied to the first net.

Calculating measures of bridge fault coverage for pairs of adjacent nets also can include first determining whether each net of the pairs has been tested for stuck at coverage. In another aspect, calculating measures of bridge fault coverage for pairs of adjacent nets in the circuit design can include, for each pair, determining whether the pair is tested for AND type bridge faults and OR type bridge faults. For each pair, a determination can be made as to whether each net of the pair acts as an aggressor when testing for AND type bridge faults and OR type bridge faults.

Another embodiment of the present invention can include a computer-implemented method of measuring bridge fault coverage for a test pattern for a circuit design to be implemented within a PLD. The computer-implemented method can include identifying simulation results and stuck at coverage of the circuit design for the test pattern, identifying pairs of nets in the circuit design that are adjacent, and determining each type of bridge fault for which each pair is tested according to the simulation results. The computer-implemented method also can include calculating a measure of bridge fault coverage for the test pattern according to which types of bridge faults each pair is tested and which net of each pair acts as an aggressor for each type of bridge fault tested. The measure of bridge fault coverage can be output.

Determining each type of bridge fault for which each pair is tested can include, for each pair, determining whether the pair is tested for AND type bridge faults and OR type bridge faults with each net of the pair acting as an aggressor. Each identified pair can include a first net and a second net. Accordingly, the computer-implemented method can include determining that the first net of the pair is an aggressor with respect to the second net of the pair when the first net is held at a constant logic one or zero while the second net responds to the test pattern.

In another aspect, determining each type of bridge fault for which each pair is tested can include determining whether each pair is tested for an AND type bridge fault by holding the first net at a logic zero while the second net responds to the test pattern and determining whether each identified pair is tested for an OR type bridge fault by holding the first net at a logic one while the second net responds to the test pattern.

Determining each type of bridge fault for which each pair is tested also can include determining whether each pair is tested for an AND type bridge fault by holding the second net at a logic zero while the first net responds to the test pattern and determining whether each pair is tested for an OR type bridge fault by holding the second net at a logic one while the first net responds to the test pattern.

Determining each type of bridge fault for which each pair is tested according to the simulation results also can include first determining whether each net of each pair has been tested for a single stuck at fault.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to fault analysis for a circuit design to be implemented within an integrated circuit (IC). More particularly, the embodiments relate to measuring bridge fault coverage of a given test pattern for testing an IC or circuit design as the case may be. A test pattern, specifying a set of test vectors, can be applied to a circuit design and simulated to determine stuck-at (SA) fault coverage for the test pattern in relation to the circuit design. The simulation results can be evaluated to determine a measure of coverage of the test pattern for detecting bridge faults in the circuit design.

With respect to SA faults, each net of a circuit design can be viewed independently of other nets, e.g., in isolation. While SA faults may be detected by looking at nets on an individual basis, bridge faults are a type of fault that refers to the interplay between two different nets. A defect in an IC, for example, may lead to a situation in which each net of a pair of adjacent nets appears to function properly when evaluated on an individual basis, but when observed as a pair, one of the nets does not function properly. Thus, to detect bridge faults, the behavior of a net must be viewed in combination with the behavior of another, adjacent net.

A "bridge fault," as used herein, can refer to a defect within an IC that occurs between two routing resources or wires of different nets. For example, two nets that are adjacent to one another may be shorted together, due to a manufacturing defect. In another example, one or both of the nets of an adjacent pair of nets may be open circuits. When a bridge fault occurs with respect to a pair of nets, typically one net will be an aggressor and the other net will be a victim. That is, the signal on the aggressor net will assert itself in some manner on the victim net.

Figure 1:
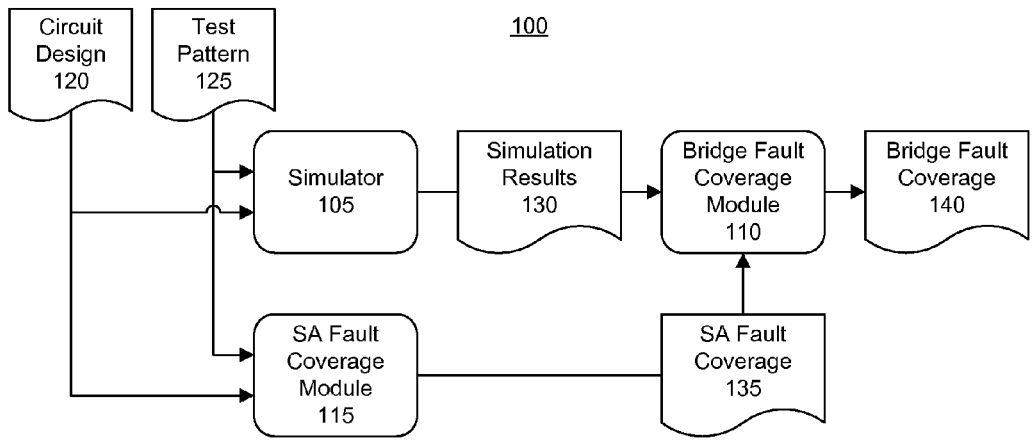
FIG. 1 is a block diagram illustrating a system for determining bridge fault coverage for a test pattern in accordance with one embodiment of the present invention.

FIG. 1 is a block diagram illustrating a system 100 for determining bridge fault coverage for a test pattern in accordance with one embodiment of the present invention. The system 100 can include a simulator 105, a bridge fault coverage module 110, and an SA fault coverage module 115. The simulator 105, the bridge fault coverage module 110, and the SA fault coverage module 115 can be implemented as software-based tools that execute within one or more communicatively linked data processing systems.

A data processing system, e.g., a computer or computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

It should be appreciated that the simulator 105, the bridge fault coverage module 110, and the SA fault coverage module 115 can execute in separate data processing systems or within a same data processing system. Further, while illustrated as three, independent applications, the functionality of the simulator 105, the bridge fault coverage module 110, and the SA fault coverage module 115 can be merged into two applications or a single, larger application. Accordingly, the embodiments disclosed herein are not limited by the example shown in FIG. 1.

In operation, a circuit design 120 can be loaded into the simulator 105. The circuit design 120 can be a programmatic description of a circuit that is to be implemented within a target IC, such as a field programmable gate array. For example, the circuit design 120 can be specified as a netlist, one or more hardware description language files, or the like. The circuit design 120 can include, or specify, placement and routing information for the circuit as it relates to a particular target IC.

A test pattern 125 can be provided to the simulator 105 and applied to the circuit design 120. As known, each test vector of the test pattern 125 can specify a series of logic zeros and ones that can be provided to the circuit design 120 at various pins or ports. In one embodiment, a test pattern, such as test pattern 125, can specify a particular region or portion of the circuit design, e.g., the sub-section, that is tested by the test vectors contained therein.

The simulator 105 can simulate operation of the circuit design and output simulation results 130. The simulation results 130 can correlate the test vectors of test pattern 125 that were applied to the circuit design 120 with the output observed as a result of the application of each respective test vector to the circuit design 120. Accordingly, an analysis of the simulation results 130 allows one to determine which nets are toggling in response to which inputs, e.g., test vectors, and at what times during the simulation.

As used herein, "outputting" and/or "output" can mean, for example, writing to a file, writing to a user display or other output device, playing audible notifications, sending or transmitting to another system, exporting, or the like. In this respect, it should be appreciated that the simulation results 130 may be stored within persistent storage and recalled or used at a later time.

The circuit design 120 and the test pattern 125 also can be input to the SA fault coverage module 115. The SA fault coverage module 115 can analyze the circuit design 120 with respect to the test pattern 125 and determine a measure of SA fault coverage 135. For example, the SA fault coverage module 115 can perform a simulation of the circuit design 120 using the test pattern 125. The measure of SA fault coverage 135 can indicate the amount or number of SA faults that are tested by the set of test pattern 125 of the possible SA faults that may occur in circuit design 120. The SA fault coverage may be expressed as a percentage, as a ratio, or the like. In addition, the SA fault coverage 135 can specify which nets of the circuit design 120 have been tested for SA faults, the test vector(s) of the test pattern 125 applied to each respective net, and which nets have not been tested for SA faults.

Generally, the measure of SA fault coverage 135 for the circuit design 120 can be determined by sub-dividing resources used by the circuit design 120 into sub-blocks. The test pattern 125 can be created to test these sub-blocks. Stimulus can be provided to the various inputs of the circuit design 120 by applying the test vectors of the test pattern 125. The outputs of the circuit design 120 can be observed to determine whether expected values are output. To detect a SA 0 fault on a resource such as a net, one or more transitions of zero to one and/or one to zero must be stimulated at the source of the net. The load(s) of the net are then observed for expected switching behavior.

For example, a series of test vectors can be injected at sources S1 and S2. The test vectors contain transitions between zero and one. At the load L1, the load for source S1, and load L2, the load for source S2, a set of transitions is expected. It should be appreciated that there need not be a one-to-one relationship between the input transitions and the output transitions. The output transitions will depend on the logic implemented within the sources S1 and S2 and the loads L1 and L2. Still, one or more transitions should be observable at each load. If the net connecting source S1 and load L1 has a SA 0 fault, the value seen at load L1 will always be zero despite any transitions in the test vector applied to source S1. If the load L1 does not transition at the expected time, the SA 0 fault is detected. Similarly, if the net connecting source S1 and load L1 has a SA 1 fault, the value seen at load L1 will always be one despite the source S1 transitioning between zero and one. Since the value zero is not observed at the expected time, the pattern has caught the SA 1 fault.

Test pattern coverage for detecting SA faults can be on the order of 99.9%. This high degree of coverage ensures that the test patterns detect nearly any non-functional logic on the IC that is used by the circuit design 120.

The SA fault coverage 135 that is output from the SA fault coverage module 115 can be provided to the bridge fault coverage module 110. As shown, the simulation results 130 can also be provided to the bridge fault coverage module 110. The bridge fault coverage module 110 can evaluate the simulation results 130 and the SA fault coverage 135 to determine a measure of bridge fault coverage 140. The measure of bridge fault coverage 140 can be output from the bridge fault coverage module 110.

Figure 2:
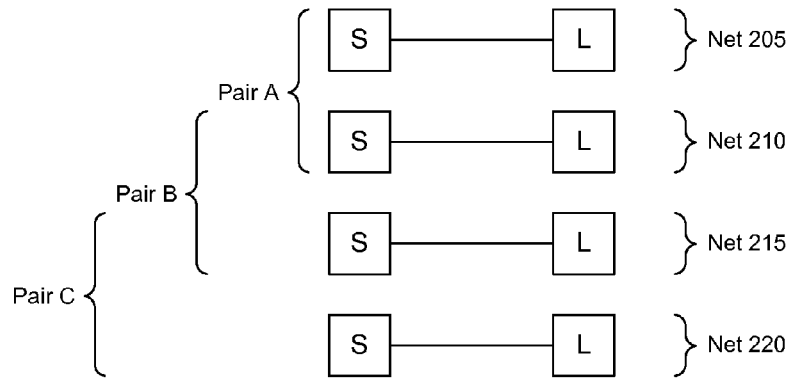
FIG. 2 is a second block diagram illustrating an aspect of determining bridge fault coverage in accordance with another embodiment of the present invention.

FIG. 2 is a second block diagram illustrating an aspect of determining bridge fault coverage in accordance with another embodiment of the present invention. When determining bridge fault coverage for a test pattern, nets of the circuit design that are adjacent to one another are identified. Such is the case as bridge faults, by definition, occur between adjacent routing resources. Thus, the identification of pairs of adjacent nets within the circuit design can be performed, where each net refers to a source node (source), a load node (load), and at least one routing resource or wire linking the source with the load.

As shown, FIG. 2 depicts a plurality of nets 205, 210, 215, and 220, with each net comprising a source "S" and a load denoted as "L." The placement of each net relative to another can correspond to the physical placement of such nets on a physical implementation of a circuit design instantiated within an IC. With reference to FIG. 2, for example, several pairs of adjacent nets can be identified. In one embodiment, adjacent pairs of nets can be defined as two nets having wires that are immediately next to one another without any intervening wires. For example, pair A, including nets 205 and 210, can be identified as an adjacent pair of nets. Pair B, including nets 210 and 215, can be identified as an adjacent pair of nets. Pair C, including nets 215 and 220, can be identified as an adjacent pair of nets.

In another embodiment, adjacent pairs can be defined in terms of distance on the IC. In such an embodiment, it would be possible that net 205 and net 215 can be considered adjacent if the routing resource linking the source and load of net 205 is within a minimum predetermined distance of the routing resource linking the source and load of net 215. Net 205 may be considered adjacent to net 220 if within a minimum predetermined distance. Where distance is used to determine whether nets are adjacent, intervening nets, e.g., net 210 disposed between net 205 and 215, would not factor into the adjacency determination.

In the example pictured in FIG. 2, adjacent nets can be those nets that include at least some portion of a routing resource running parallel to one another. For example, when one net has a routing resource that is immediately next to a routing resource of another net, or within a minimum predetermined distance, whether the nets remain parallel or are only parallel with respect to a limited portion of each net, the two nets can be considered an adjacent pair of nets. In this regard, it may be possible for a given net to be adjacent to more than one other net, e.g., when the net changes directions and becomes parallel to another net or the net is long and runs parallel to more than one shorter net.

Figure 3:
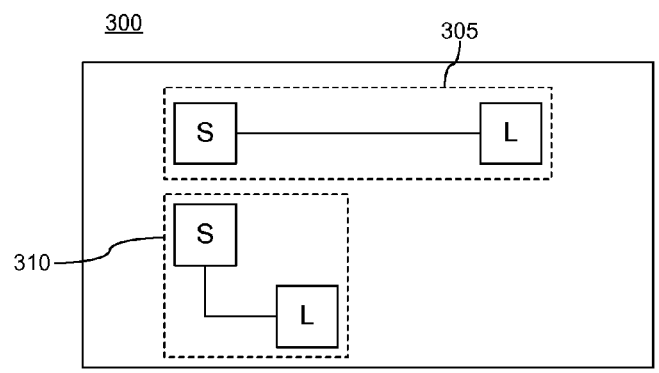
FIG. 3 is a third block diagram illustrating an aspect of determining bridge fault coverage in accordance with another embodiment of the present invention.

FIG. 3 is a third block diagram illustrating an aspect of determining bridge fault coverage in accordance with another embodiment of the present invention. FIG. 3 illustrates an embodiment in which adjacency can be determined according to whether two nets are located within a same programmable tile of a programmable logic device (PLD). For example, in the case of a field programmable gate array (FPGA) type of PLD, the device is organized into a grid of programmable tiles. Each programmable tile can include programmable logic, e.g., a look-up table and other circuitry, and a programmable interconnect that links the programmable tile with available routing circuitry on the FPGA. In the example presented in FIG. 3, two nets can be considered adjacent to one another when those nets are located within a same programmable tile 300 of a PLD. Thus, net 305 can be said to be adjacent to net 310 despite not being parallel in the manner described with reference to FIG. 2.

Figure 4:
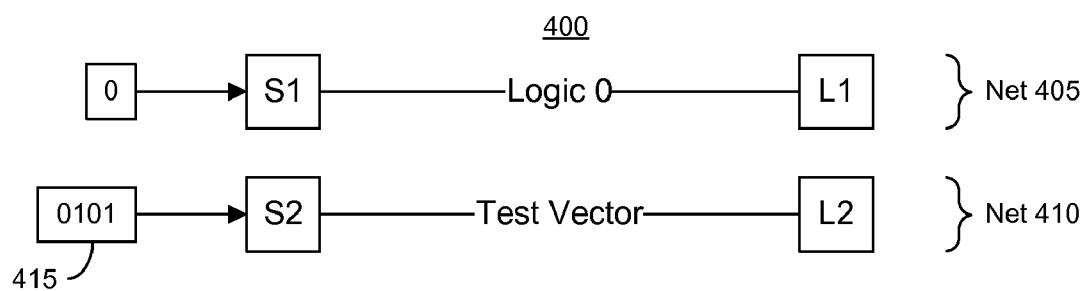
FIG. 4 is a fourth block diagram illustrating an aspect of determining bridge fault coverage in accordance with another embodiment of the present invention.

FIG. 4 is a fourth block diagram illustrating an aspect of determining bridge fault coverage in accordance with another embodiment of the present invention. FIG. 4 illustrates a scenario for detecting a "wired AND" type of bridge fault. A wired AND type of bridge fault refers to the situation in which one net of a pair of adjacent nets, referred to as the aggressor, asserts itself on the other net of the pair, referred to as the victim.

FIG. 4 illustrates an adjacent pair of nets 400 including nets 405 and 410. In this example, net 405 can be the aggressor while net 410 can be the victim. Values detected at the load L1 of the aggressor net 405 will be as expected given a particular input to net 405 at source S1. The values observed at the load L2 of the victim net 410 will be incorrect given the input provided to source S2. The aggressor net 405 asserts itself on victim net 410 such that the values observed at the load L2 of victim net 410 correspond to a logical AND operation being performed using the value on net 405 and the value(s) on net 410.

Accordingly, to detect a wired AND type of fault, net 405 can be held at a logic zero while a test vector 415 is applied to net 410 at source S2. If this situation is observed in the simulation results, a determination can be made that pair 400 is tested for a wired AND type of bridge fault. For example, if net 405 is held at a logic zero and a wired AND type of bridge fault exists between net 405 and net 410, the load L2 of net 410 would not switch according to the test pattern 415 applied to the source S2 of net 410. Rather, the load L2 of net 410 would remain at logic zero.

After testing pair 400 with net 405 as the aggressor, the roles of the two nets should be reversed to properly test pair 400 for wired AND type bridge faults. That is, the situation where net 410 acts as an aggressor and net 405 acts as a victim should be tested. Thus, to test for a wired AND type of bridge fault with net 410 being the aggressor and net 405 being the victim, net 410 can be held at a logic zero while net 405 is supplied with a test pattern. To properly test pair 400 for wired AND type of bridge faults, both scenarios must be checked. A test pattern that implements both scenarios properly tests pair 400 for wired AND type of bridge faults.

Figure 5:
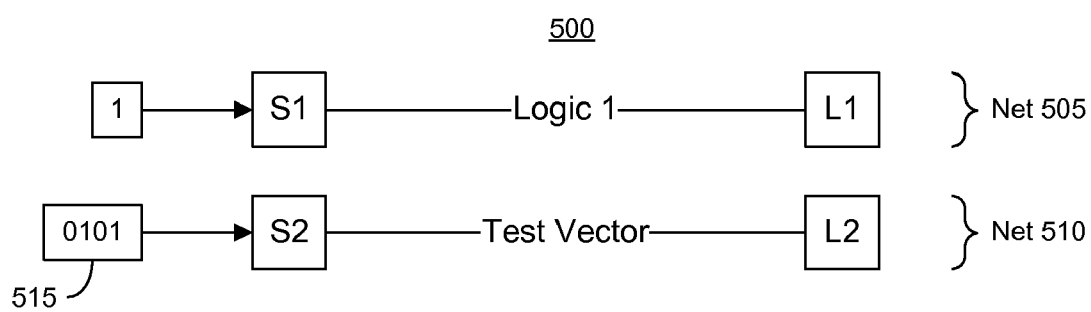
FIG. 5 is a fifth block diagram illustrating an aspect of determining bridge fault coverage in accordance with another embodiment of the present invention.

FIG. 5 is a fifth block diagram illustrating an aspect of determining bridge fault coverage in accordance with another embodiment of the present invention. FIG. 5 illustrates a scenario for detecting a "wired OR" type of bridge fault. A wired OR type of bridge fault refers to the situation in which the aggressor asserts itself on the victim and the values observed at the victim load correspond to a logical OR operation being performed between the values on the aggressor net and the values on the victim net.

Accordingly, with adjacent pair 500, net 505 can be the aggressor and be held at a value of logic one. Net 510 can be the victim and be provided with a test vector 515. If the load L2 of net 510 toggles with the test vector 515 supplied to the source S2 of net 510, no wired OR type of bridge fault is detected. If, however, the load L2 of net 510 remains at a logic one and does not toggle with the test vector 515 supplied to the source S2 of net 510, a wired OR type of bridge fault is observed.

As noted with respect to FIG. 4, the roles of the nets should be reversed for completeness. That is, the simulation results should be evaluated to determine whether net 510 is held at a logic one, acting as the aggressor, while net 505 is allowed to toggle according to a provided test vector. Accordingly, if the test pattern implements both scenarios, e.g., where each net of the pair 500 is checked as an aggressor node, a wired OR type of bridge fault is tested for pair 500.

From the discussion of FIGS. 4 and 5, it should be appreciated that to test a pair of adjacent nets for both wired AND type and wired OR type bridge faults, four different cases must be found within the simulation results. For purposes of illustration, it can be assumed that the pair of adjacent nets includes a first net and a second net. Accordingly, the first case can be where the first net is held at a logic one while a test vector is provided to the second net (wired AND with net one as aggressor). The second case can be where the first net is held at a logic zero while a test vector is provided to the second net (wired OR with net one as aggressor). The third case can be where the second net is held at a logic one while a test vector is provided to the first net (wired AND with net two as aggressor). The fourth case can be where the second net is held at a logic zero while a test vector is provided to the first net (wired OR with net two as aggressor).

Accordingly, for a given pair of adjacent nets, the four cases must be observed in the simulation results to ensure complete coverage, e.g., 100% coverage, of bridge faults for the pair. This analysis also assumes a high degree of SA fault analysis coverage. That is, to begin bridge fault analysis, one must presume that SA fault coverage is high. If, for example, a net of a pair of adjacent nets is not tested for an SA fault, the highest bridge fault coverage for that pair will be 50%.

In illustration and with reference to FIG. 5, assume that load L1 of net 505 is not instantiated within an IC, but net 510 is properly instantiated. The behavior of load L1 of net 505 cannot be observed. While bridge faults with net 505 being the aggressor on net 510 can be observed, bridge faults with net 510 acting as the aggressor on net 505 cannot be observed without load L1. Thus, to ensure that a pair of nets is adequately tested for bridge faults and measure bridge fault coverage, each net of a pair of adjacent nets must be tested with respect to SA faults.

Accordingly, to determine bridge fault coverage, the SA coverage for the resources/nets of interest can be determined. From the SA coverage, bridge fault coverage can be extrapolated. In this regard, bridge fault coverage obtained by a test pattern is highly correlated to the SA coverage of the test pattern.

Figure 6:
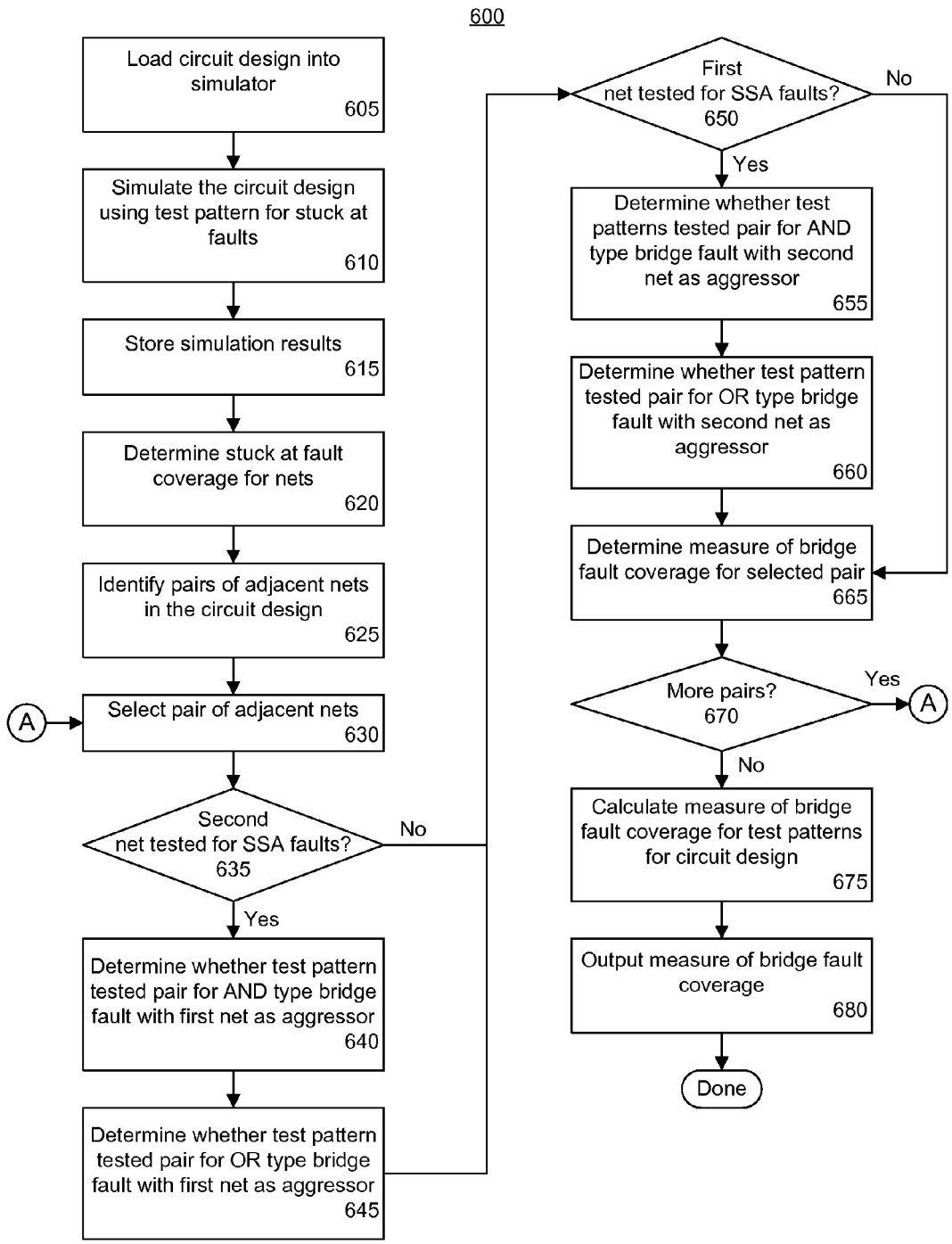
FIG. 6 is a flow chart illustrating a method of determining bridge fault coverage for a test pattern in accordance with another embodiment of the present invention.

FIG. 6 is a flow chart illustrating a method 600 of measuring bridge fault coverage for a test pattern in accordance with another embodiment of the present invention. The method 600 can be performed using a system as described with reference to FIG. 1. The method 600 can begin in step 605, where a circuit design can be loaded into a simulator.

In step 610, the circuit design can be simulated using a test pattern designed or generated for testing SA faults with respect to the loaded circuit design. The test pattern can be applied to the circuit design and the resulting outputs of the circuit design can be observed. In step 615, the simulation results can be stored. As noted, the simulation results can specify timing information in terms of what each node of the circuit design is doing, e.g., its state, at any given time during the simulation. As known, such simulation results can list the state of nodes of the circuit design on a cycle-by-cycle basis.

In step 620, the system can determine the SA fault coverage of the test pattern applied to the circuit design during simulation. The SA fault coverage can be calculated and output. Determining SA fault coverage is a process that is known in the art and which can be performed using any of a variety of commercially available design tools. In one embodiment, the SA fault coverage can indicate an overall percentage of SA fault coverage for the test pattern. In another embodiment, the SA fault coverage can specify or indicate which nets of the circuit design have been tested, on an individual basis, for SA faults.

It should be appreciated that in another embodiment of the present invention, SA fault analysis and/or simulation using the test pattern may already have been performed. In that case, the simulation results and the SA fault coverage can be made available and read or otherwise identified by the system and utilized in measuring bridge fault coverage of the test pattern with respect to the circuit design.

In step 625, the system can identify pairs of adjacent nets in the circuit design. With respect to an FPGA, only nets utilized by the circuit design need be searched to identify adjacent pairs of nets. Those nets that exist in the target device but are not utilized by the circuit design need not be evaluated. Adjacent nets can be identified from an analysis of the circuit design as the design can include placement and routing information.

In step 630, the system can select a pair of adjacent nets for evaluation. The selected pair of adjacent nets can include a first net and a second net. In step 635, the system can make a determination as to whether the second net of the selected pair has been tested for SA faults. That is, the simulation results can be processed to determine whether a test pattern has been applied to the second net and whether the behavior of the load of the second net was observed, e.g., recorded, when the test pattern was applied. If the second net was tested for SA faults, the method can proceed to step 640. If not, the method can continue to step 650. It should be appreciated that when the second net is not tested for SA faults, the selected pair cannot be tested for bridge faults for cases where the first net acts as an aggressor and the second net acts as a victim.

In step 640, the system can determine whether the test pattern tested the selected pair for an AND type of bridge fault with the first net acting as an aggressor. The result of this determination can be stored. In step 645, the system can determine whether the test pattern tests the selected pair for an OR type of bridge fault with the first net acting as the aggressor. The result of this determination also can be stored.

In step 650, a determination can be made as to whether the first net of the selected pair has been tested for SA faults. If the first net was tested for SA faults, the method can proceed to step 655. If not, the method can continue to step 665. It should be appreciated that when the first net is not tested for SA faults, the selected pair cannot be tested for bridge faults where the second net acts as an aggressor and the first net acts as a victim.

In step 655, the system can determine whether the test pattern tested the selected pair for an AND type of bridge fault with the second net acting as an aggressor. The result of this determination can be stored. In step 660, the system can determine whether the test pattern tests the selected pair for an OR type of bridge fault with the second net acting as the aggressor. The result of this determination also can be stored.

In step 665, a measure of bridge fault coverage for the selected pair can be calculated. For example, if all four cases of bridge faults are tested by the test pattern, the bridge fault coverage for the selected pair can be 100%. If only three cases are tested, the bridge fault coverage for the selected pair can be 75%. Two tested cases correspond to 50% coverage, while one tested case would correspond to 25% coverage for the pair.

In step 670, a determination can be made as to whether further pairs from the pairs of adjacent nets identified in step 620 remain to be processed. If so, the method can loop back to step 630 to select another pair of adjacent nets to be processed. The method 600 can continue until such time that no further pairs of adjacent nets remain to be processed.

In step 675, a measure of bridge fault coverage for the test pattern for the circuit design can be determined, e.g., calculated. As noted, each pair of adjacent nets can be tested for four different scenarios in terms of bridge faults. Accordingly, the measure of bridge fault coverage for the test pattern, with respect to the circuit design, can reflect the number of scenarios that the test pattern tests for each pair of adjacent nets.

It should be appreciated that while a total measure of bridge fault coverage can be determined, the system also can output a report indicating which types of bridge faults were tested for each pair of adjacent nets and which scenarios, in terms of nets being aggressor and/or victim, were tested for each pair of adjacent nets by the test pattern. Such information can be specified as a percentage of the entire circuit design or on a pair-by-pair basis.

In step 680, the measure of bridge fault coverage can be output. Additionally, any other data as described herein may be output, e.g., as a report or through some other graphical user interface.

An FPGA is used within this specification, by way of example, to better illustrate the various embodiments of the present invention. It should be appreciated, however, that the embodiments disclosed herein can be applied to other types of PLDs. The embodiments described herein, for example, can be applied to Complex Programmable Logic Devices (CPLDs), Programmable Logic Arrays (PLAs) and Programmable Array Logic (PAL) devices, as well as mask programmable logic devices that can be programmed by applying a processing layer, such as a metal layer, that programmably interconnects the various elements on the device. Other types of PLDs can be implemented in other ways, e.g., using fuse or antifuse technology. Accordingly, the terms "PLD" and "programmable logic device" can include but are not limited to these exemplary devices and further can encompass devices that are only partially programmable.

The embodiments presented herein relate to determining bridge fault coverage for a test pattern. The test pattern can be applied to a circuit design using a simulator. The simulation results and SA fault coverage of the test pattern can be evaluated to derive a measure of bridge fault coverage for the test pattern that was not previously available. The bridge fault coverage of the test pattern indicates the quality and completeness of the test pattern with respect to testing a given circuit design for bridge faults.

The figures illustrate the architecture, functionality, and operation of possible implementations of systems, methods and computer program products according to various embodiments of the present invention. In this regard, each block in the figures, including the flowchart, may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the illustrations, and combinations of blocks in the illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing system. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of measuring bridge fault coverage for a test pattern for a circuit design for an integrated circuit, the computer-implemented method comprising:
   simulating the circuit design using the test pattern to generate simulation results;
   determining stuck at coverage for the test pattern;
   calculating, by a processor, respective measures of bridge fault coverage for pairs of adjacent nets comprising a first net and a second net in the circuit design on a per-pair basis, wherein calculating comprises:
      for each pair of adjacent nets, performing steps including:
         determining from the test pattern and simulation results whether or not the test pattern tests the first and second nets of the pair for stuck at faults;
         in response to determining that the test pattern tests the second net of the pair for a stuck at fault, determining whether, from the simulation results, the first net is held constant while the second net toggles according to the test pattern applied to the second net; and
         in response to determining that the test pattern tests the first net of the pair for a stuck at fault, determining whether, from the simulation results, the second net is held constant while the first net toggles according to the test pattern applied to the first net;
         calculating the respective measure of bridge fault coverage for the pair of adjacent nets as a function of whether or not the first net was determined to be constant while the second net toggles, and whether or not the second net was determined to be constant while the first net toggles;
   determining a measure of bridge fault coverage for the entire circuit design according to the respective measures of bridge fault coverage for the pairs; and
   outputting the measure of bridge fault coverage.

2. The computer-implemented method of claim 1, wherein determining whether, from the simulation results, the first net of the pair is held constant comprises:
   determining whether the first net of the pair is held at a logic zero while the second net toggles between a logic one and a logic zero according to the test pattern applied to the second net; and
   determining whether the first net of the pair is held at a logic one while the second net toggles between a logic one and a logic zero according to the test pattern applied to the second net.

3. The computer-implemented method of claim 1, wherein determining whether, from the simulation results, the second net of the pair is held constant comprises:
   determining whether the second net of the pair is held at a logic zero while the first net toggles between a logic one and a logic zero according to the test pattern applied to the first net; and
   determining whether the second net of the pair is held at a logic one while the first net toggles between a logic one and a logic zero according to the test pattern applied to the first net.

4. The computer-implemented method of claim 1, wherein calculating measures of bridge fault coverage for pairs of adjacent nets in the circuit design comprises, for each pair, determining whether the pair is tested for AND type bridge faults and OR type bridge faults.

5. The computer-implemented method of claim 4, wherein calculating measures of bridge fault coverage for pairs of adjacent nets in the circuit design comprises, for each pair, determining whether each net of the pair acts as an aggressor when testing for AND type bridge faults and OR type bridge faults.

6. The computer-implemented method of claim 1, wherein the first net and the second net of each pair of adjacent nets are located within a same programmable tile of the integrated circuit.

7. A computer-implemented method of measuring bridge fault coverage for a test pattern for a circuit design to be implemented within an integrated circuit, the computer-implemented method comprising:
   identifying simulation results and stuck at coverage of the circuit design for the test pattern;
   identifying pairs of first and second nets in the circuit design that are adjacent;
   determining for each identified pair of first and second nets, whether or not the test pattern tests the first and second net of the pair for stuck at faults according to the simulation results;
   for each pair of adjacent nets, calculating, by a processor, a respective measure of bridge fault coverage according to each net of the pair acting as an aggressor for each type of bridge fault test, wherein the calculating includes:
      in response to determining that the test pattern tests the second net of the pair for a stuck at fault, determining whether, from the simulation results, the first net is held constant while the second net toggles according to the test pattern applied to the second net; and
      in response to determining that the test pattern tests the first net of the pair for a stuck at fault, determining whether, from the simulation results, the second net is held constant while the first net toggles according to the test pattern applied to the first net; and
      calculating the respective measure of bridge fault coverage for the pair of adjacent nets as a function of whether or not the first net was determined to be constant while the second net toggles, and whether or not the second net was determined to be constant while the first net toggles;
   calculating bridge fault coverage for the test pattern according to the respective measures of bridge fault coverage for the pairs of adjacent nets; and
   outputting the measure of bridge fault coverage.

8. The computer-implemented method of claim 7, wherein the determining whether the first net is held constant while the second net toggles according to the test pattern applied to the second net comprises:
   determining whether the pair is tested for an AND type bridge fault by holding the first net at a logic zero while the second net responds to a test pattern; and
   determining whether the pair is tested for an OR type bridge fault by holding the first net at a logic one while the second net responds to a test pattern.

9. The computer-implemented method of claim 8, wherein the determining whether the second net is held constant while the first net toggles according to the test pattern applied to the first net comprises:
   determining whether the pair is tested for an AND type bridge fault by holding the second net at a logic zero while the first net responds to a test pattern; and
   determining whether the pair is tested for an OR type bridge fault by holding the second net at a logic one while the first net responds to a test pattern.

10. A computer program product comprising:
   a computer-usable medium comprising computer-usable program code that measures bridge fault coverage for a test pattern for a circuit design to be implemented within an integrated circuit, the computer-usable medium comprising:
   computer-usable program code that identifies simulation results and stuck at coverage of the circuit design for the test pattern;
   computer-usable program code that identifies pairs of first and second nets in the circuit design that are adjacent;
   computer-usable program code that determines for each identified pair of first and second nets, whether or not the test pattern tests the first and second net of the pair for stuck at faults according to the simulation results;
   computer-usable program code that calculates for each pair of adjacent nets, a respective measure of bridge fault coverage according to each net acting as an aggressor for each type of bridge fault test, wherein the calculating includes:
      in response to determining that the test pattern tests the second net of the pair for a stuck at fault, determining whether, from the simulation results, the first net is held constant while the second net toggles according to the test pattern applied to the second net; and
      in response to determining that the test pattern tests the first net of the pair for a stuck at fault, determining whether, from the simulation results, the second net is held constant while the first net toggles according to the test pattern applied to the first net; and
      calculating the respective measure of bridge fault coverage for the pair of adjacent nets as a function of whether or not the first net was determined to be constant while the second net toggles, and whether or not the second net was determined to be constant while the first net toggles;
   computer-usable program code that calculates bridge fault coverage for the test pattern according to the measures of bridge fault coverage for the pairs of adjacent nets; and
   computer-usable program code that outputs the measure of bridge fault coverage.

11. The computer program product of claim 10, wherein the computer-usable program code that determines whether the first net is held constant while the second net toggles according to the test pattern applied to the second net comprises:
   computer-usable program code that determines whether the pair is tested for an AND type bridge fault by holding the first net at a logic zero while the second net responds to a test pattern; and
   computer-usable program code that determines whether the pair is tested for an OR type bridge fault by holding the first net at a logic one while the second net responds to a test pattern.

12. The computer program product of claim 11, wherein the computer-usable program code that determines whether the second net is held constant while the first net toggles according to the test pattern applied to the first net comprises:
   computer-usable program code that determines whether the pair is tested for an AND type bridge fault by holding the second net at a logic zero while the first net responds to a test pattern; and computer-usable program code that determines whether the pair is tested for an OR type bridge fault by holding the second net at a logic one while the first net responds to a test pattern.

13. The computer program product of claim 10, wherein the computer-usable medium further comprises:

computer-usable program code that, when at least one net of a pair has not been tested for a single stuck at fault, determines that the pair is not tested for a bridge fault.

\* \* \* \* \*